US010545819B1

(12) United States Patent
Lu

(10) Patent No.: US 10,545,819 B1
(45) Date of Patent: *Jan. 28, 2020

(54) SOFT-DECISION INPUT GENERATION FOR DATA STORAGE SYSTEMS

(71) Applicant: Western Digital Technologies, Inc., Irvine, CA (US)

(72) Inventor: Guangming Lu, Irvine, CA (US)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 189 days.

This patent is subject to a terminal disclaimer.

(21) Appl. No.: 14/584,326

(22) Filed: Dec. 29, 2014

Related U.S. Application Data

(63) Continuation of application No. 13/797,923, filed on Mar. 12, 2013, now Pat. No. 8,924,824.

(51) Int. Cl.
*G06F 11/10* (2006.01)
*G11C 29/52* (2006.01)
*G06F 12/02* (2006.01)
*G06F 3/06* (2006.01)
*G11C 16/08* (2006.01)
*H03M 13/11* (2006.01)
*H03M 13/45* (2006.01)
*H03M 13/37* (2006.01)

(52) U.S. Cl.
CPC ...... *G06F 11/1004* (2013.01); *G06F 11/1072* (2013.01); *G11C 29/52* (2013.01); *G06F 3/0679* (2013.01); *G06F 3/0688* (2013.01); *G06F 11/1068* (2013.01); *G06F 12/0246* (2013.01); *G11C 16/08* (2013.01); *H03M 13/1111* (2013.01); *H03M 13/3784* (2013.01); *H03M 13/45* (2013.01)

(58) Field of Classification Search
CPC ............ G06F 11/1068; G06F 12/0246; G06F 11/1072; G06F 3/0679; G06F 3/0688; G06F 11/1004; G11C 29/52; G11C 16/08; H03M 13/1111; H03M 13/45; H03M 13/3784
USPC ........................................................ 714/780
See application file for complete search history.

(56) References Cited

U.S. PATENT DOCUMENTS

| 5,299,162 | A | 3/1994 | Kim et al. |
| 6,385,111 | B2 * | 5/2002 | Tran ................ G11C 7/14 365/158 |
| 6,856,556 | B1 | 2/2005 | Hajeck |
| 7,126,857 | B2 | 10/2006 | Hajeck |
| 7,430,136 | B2 | 9/2008 | Merry, Jr. et al. |
| 7,447,807 | B1 | 11/2008 | Merry et al. |

(Continued)

OTHER PUBLICATIONS

Notice of Allowance dated Aug. 28, 2014 from U.S. Appl. No. 13/797,923, 8 pages.

*Primary Examiner* — April Y Blair
*Assistant Examiner* — Sazzad Hossain
(74) *Attorney, Agent, or Firm* — Morgan, Lewis & Bockius LLP

(57) ABSTRACT

An error management system for a data storage device can generate soft-decision log-likelihood ratios (LLRs) using multiple reads of memory locations. 0-to-1 and 1-to-0 bit flip count data provided by multiple reads of reference memory locations can be used to generate probability data that is used to generate possible LLR values for decoding target pages. Possible LLR values are stored in one or more look-up tables.

16 Claims, 12 Drawing Sheets

(56) References Cited

U.S. PATENT DOCUMENTS

| | | |
|---|---|---|
| 7,502,256 B2 | 3/2009 | Merry, Jr. et al. |
| 7,509,441 B1 | 3/2009 | Merry et al. |
| 7,558,109 B2 | 7/2009 | Brandman et al. |
| 7,596,643 B2 | 9/2009 | Merry, Jr. et al. |
| 7,653,778 B2 | 1/2010 | Merry, Jr. et al. |
| 7,685,337 B2 | 3/2010 | Merry, Jr. et al. |
| 7,685,338 B2 | 3/2010 | Merry, Jr. et al. |
| 7,685,374 B2 | 3/2010 | Diggs et al. |
| 7,733,712 B1 | 6/2010 | Walston et al. |
| 7,765,373 B1 | 7/2010 | Merry et al. |
| 7,805,663 B2 | 9/2010 | Brandman et al. |
| 7,898,855 B2 | 3/2011 | Merry, Jr. et al. |
| 7,904,793 B2 | 3/2011 | Mokhlesi et al. |
| 7,912,991 B1 | 3/2011 | Merry et al. |
| 7,936,603 B2 | 5/2011 | Merry, Jr. et al. |
| 7,962,792 B2 | 6/2011 | Diggs et al. |
| 8,078,918 B2 | 12/2011 | Diggs et al. |
| 8,090,899 B1 | 1/2012 | Syu |
| 8,095,851 B2 | 1/2012 | Diggs et al. |
| 8,108,692 B1 | 1/2012 | Merry et al. |
| 8,122,185 B2 | 2/2012 | Merry, Jr. et al. |
| 8,127,048 B1 | 2/2012 | Merry et al. |
| 8,135,903 B1 | 3/2012 | Kan |
| 8,151,020 B2 | 4/2012 | Merry, Jr. et al. |
| 8,156,398 B2 | 4/2012 | Sommer |
| 8,156,403 B2 | 4/2012 | Shalvi et al. |
| 8,161,227 B1 | 4/2012 | Diggs et al. |
| 8,166,245 B2 | 4/2012 | Diggs et al. |
| 8,243,514 B2 | 8/2012 | Kang et al. |
| 8,243,525 B1 | 8/2012 | Kan |
| 8,254,172 B1 | 8/2012 | Kan |
| 8,261,012 B2 | 9/2012 | Kan |
| 8,296,625 B2 | 10/2012 | Diggs et al. |
| 8,312,207 B2 | 11/2012 | Merry, Jr. et al. |
| 8,316,176 B1 | 11/2012 | Phan et al. |
| 8,341,339 B1 | 12/2012 | Boyle et al. |
| 8,375,151 B1 | 2/2013 | Kan |
| 8,392,635 B2 | 3/2013 | Booth et al. |
| 8,397,107 B1 | 3/2013 | Syu et al. |
| 8,407,449 B1 | 3/2013 | Colon et al. |
| 8,423,722 B1 | 4/2013 | Deforest et al. |
| 8,433,858 B1 | 4/2013 | Diggs et al. |
| 8,443,167 B1 | 5/2013 | Fallone et al. |
| 8,447,920 B1 | 5/2013 | Syu |
| 8,458,435 B1 | 6/2013 | Rainey, III et al. |
| 8,478,930 B1 | 7/2013 | Syu |
| 8,489,854 B1 | 7/2013 | Colon et al. |
| 8,503,237 B1 | 8/2013 | Horn |
| 8,521,972 B1 | 8/2013 | Boyle et al. |
| 8,549,236 B2 | 10/2013 | Diggs et al. |
| 8,583,835 B1 | 11/2013 | Kan |
| 8,601,311 B2 | 12/2013 | Horn |
| 8,601,313 B1 | 12/2013 | Horn |
| 8,612,669 B1 | 12/2013 | Syu et al. |
| 8,612,804 B1 | 12/2013 | Kang et al. |
| 8,615,681 B2 | 12/2013 | Horn |
| 8,638,602 B1 | 1/2014 | Horn |
| 8,639,872 B1 | 1/2014 | Boyle et al. |
| 8,683,113 B2 | 3/2014 | Abasto et al. |
| 8,700,834 B2 | 4/2014 | Horn et al. |
| 8,700,950 B1 | 4/2014 | Syu |
| 8,700,951 B1 | 4/2014 | Call et al. |
| 8,706,985 B1 | 4/2014 | Boyle et al. |
| 8,707,104 B1 | 4/2014 | Jean |
| 8,713,066 B1 | 4/2014 | Lo et al. |
| 8,713,357 B1 | 4/2014 | Jean et al. |
| 8,719,531 B2 | 5/2014 | Strange et al. |
| 8,724,422 B1 | 5/2014 | Agness et al. |
| 8,725,931 B1 | 5/2014 | Kang |
| 8,745,277 B2 | 6/2014 | Kan |
| 8,751,728 B1 | 6/2014 | Syu et al. |
| 8,769,190 B1 | 7/2014 | Syu et al. |
| 8,769,232 B2 | 7/2014 | Suryabudi et al. |
| 8,775,720 B1 | 7/2014 | Meyer et al. |
| 8,782,327 B1 | 7/2014 | Kang et al. |
| 8,788,778 B1 | 7/2014 | Boyle |
| 8,788,779 B1 | 7/2014 | Horn |
| 8,788,880 B1 | 7/2014 | Gosla et al. |
| 8,793,429 B1 | 7/2014 | Call et al. |
| 8,924,824 B1 * | 12/2014 | Lu .............. G06F 11/1048 365/185.2 |
| 2006/0045169 A1 * | 3/2006 | Kim .............. H04B 1/7103 375/144 |
| 2008/0052594 A1 * | 2/2008 | Yedidia .............. H03M 13/1105 714/758 |
| 2008/0222346 A1 * | 9/2008 | Raciborski .............. G06F 3/0608 711/102 |
| 2008/0250300 A1 * | 10/2008 | Mokhlesi .............. G11C 11/5642 714/780 |
| 2009/0019335 A1 * | 1/2009 | Boyer .............. H03M 13/1105 714/755 |
| 2010/0014352 A1 | 1/2010 | Aritome |
| 2010/0034319 A1 * | 2/2010 | Ludvigsen .............. H04L 1/0071 375/340 |
| 2010/0169746 A1 * | 7/2010 | Karabed .............. G11B 20/18 714/780 |
| 2010/0174849 A1 | 7/2010 | Walston et al. |
| 2010/0205363 A1 * | 8/2010 | Hwang .............. G11C 16/349 711/104 |
| 2010/0250793 A1 | 9/2010 | Syu |
| 2010/0287328 A1 * | 11/2010 | Feldman .............. G06F 12/0246 711/103 |
| 2011/0099323 A1 | 4/2011 | Syu |
| 2011/0191652 A1 | 8/2011 | Dave et al. |
| 2011/0283049 A1 | 11/2011 | Kang et al. |
| 2012/0008386 A1 * | 1/2012 | Chilappagari .............. G11C 11/5642 365/185.2 |
| 2012/0063227 A1 | 3/2012 | Weingarten et al. |
| 2012/0079354 A1 | 3/2012 | Uchikawa et al. |
| 2012/0159278 A1 * | 6/2012 | Jen .............. H04L 1/1819 714/751 |
| 2012/0236638 A1 | 9/2012 | Weingarten et al. |
| 2012/0260020 A1 | 10/2012 | Suryabudi et al. |
| 2012/0278531 A1 | 11/2012 | Horn |
| 2012/0284460 A1 | 11/2012 | Guda |
| 2012/0324191 A1 | 12/2012 | Strange et al. |
| 2013/0007559 A1 | 1/2013 | Motwani |
| 2013/0132638 A1 | 5/2013 | Horn et al. |
| 2013/0145106 A1 | 6/2013 | Kan |
| 2013/0163328 A1 * | 6/2013 | Karakulak .............. G11C 16/10 365/185.2 |
| 2013/0290793 A1 | 10/2013 | Booth et al. |
| 2014/0056064 A1 | 2/2014 | Kim et al. |
| 2014/0059405 A1 | 2/2014 | Syu et al. |
| 2014/0068382 A1 | 3/2014 | Desireddi et al. |
| 2014/0101369 A1 | 4/2014 | Tomlin et al. |
| 2014/0115427 A1 | 4/2014 | Lu |
| 2014/0133220 A1 | 5/2014 | Danilak et al. |
| 2014/0136753 A1 | 5/2014 | Tomlin et al. |
| 2014/0149826 A1 | 5/2014 | Lu et al. |
| 2014/0157078 A1 | 6/2014 | Danilak et al. |
| 2014/0181432 A1 | 6/2014 | Horn |
| 2014/0223255 A1 | 8/2014 | Lu et al. |
| 2014/0223263 A1 | 8/2014 | Sakurada et al. |

\* cited by examiner

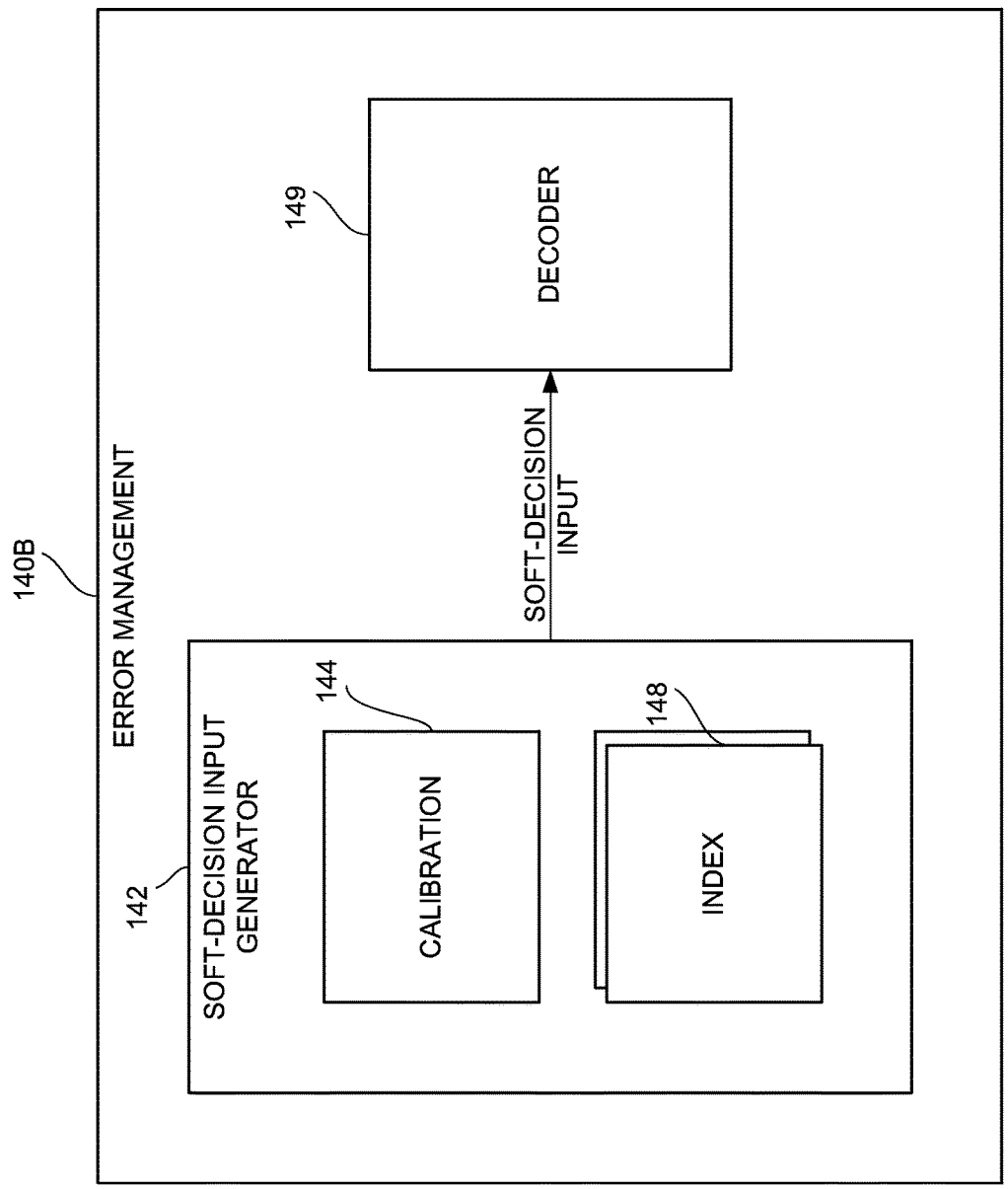

SOFT-DECISION INPUT GENERATION FOR DATA STORAGE SYSTEMS

CROSS-REFERENCE TO RELATED APPLICATIONS

The present application is a continuation application of U.S. patent application Ser. No. 13/797,923, entitled "SOFT-DECISION INPUT GENERATION FOR DATA STORAGE SYSTEMS," filed on Mar. 12, 2013, now U.S. Pat. No. 8,924,824, the disclosure of which is hereby incorporated by reference in its entirety for all purposes.

BACKGROUND

Technical Field

This disclosure relates to data storage systems. More particularly, the disclosure relates to systems and methods for generating log-likelihood ratios for data storage systems.

Description of the Related Art

Soft-decision low-density parity-check code (LDPC) error code correction (ECC) can improve the reliability of a data storage system and reduce the number of data errors. Log-likelihood ratios (LLRs) are commonly used as the inputs for soft-decision LDPC engines. Data storage systems that use flash memories (e.g., NAND) as data storage media can use LLR calculations for reading memory cells when LDPC based on single-read input is insufficient to decode the originally-stored data.

BRIEF DESCRIPTION OF THE DRAWINGS

Various embodiments are depicted in the accompanying drawings for illustrative purposes, and should in no way be interpreted as limiting the scope of the inventions. In addition, various features of different disclosed embodiments can be combined to form additional embodiments, which are part of this disclosure. Throughout the drawings, reference numbers may be reused to indicate correspondence between reference elements.

FIG. 1B is a block diagram illustrating an embodiment of an error management module.

DETAILED DESCRIPTION

Figure 1A:
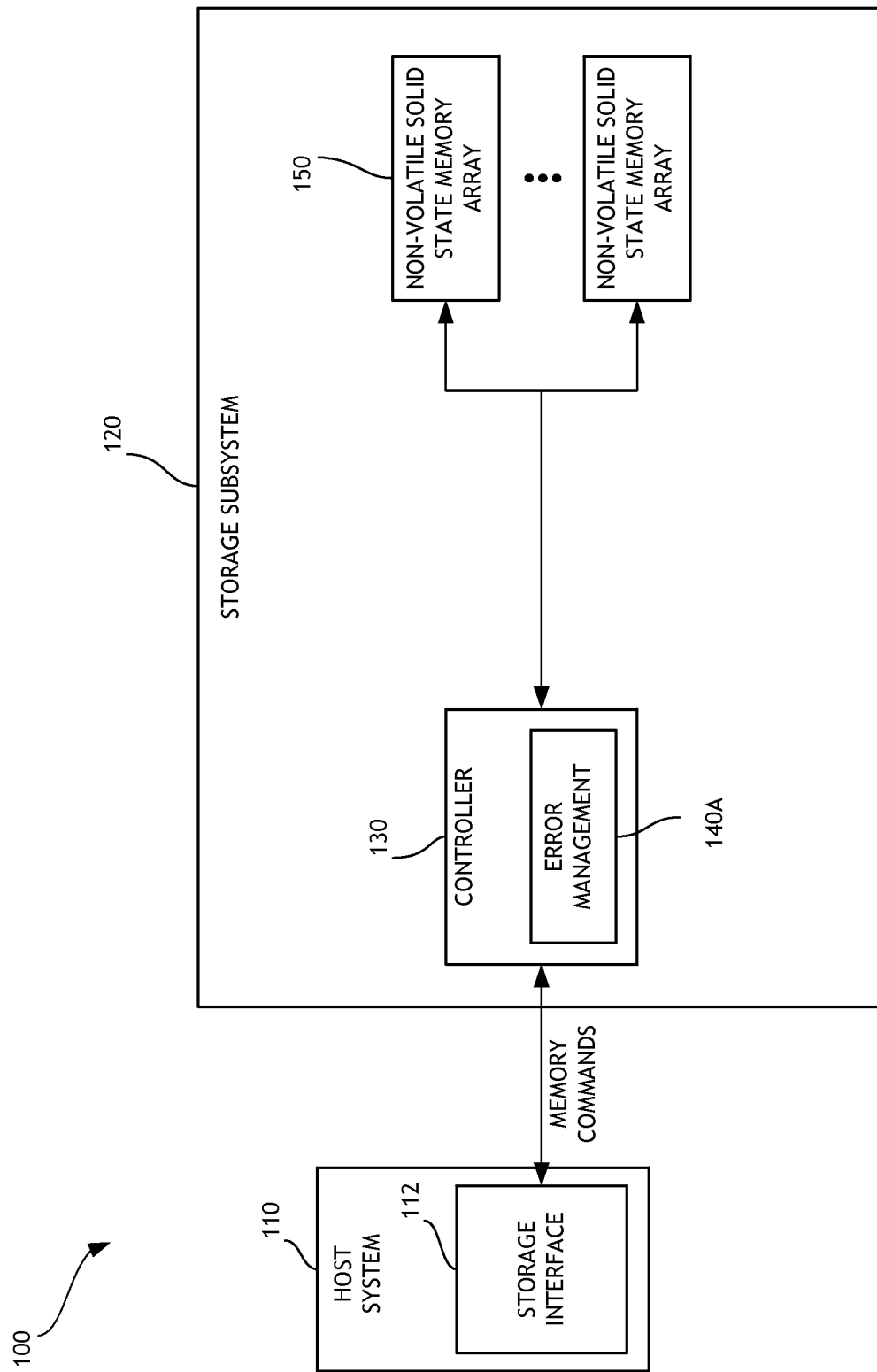
FIG. 1A is a block diagram illustrating an embodiment of a combination of a host system with storage device including an error management module.

While certain embodiments are described, these embodiments are presented by way of example only, and are not intended to limit the scope of protection. Indeed, the novel methods and systems described herein may be embodied in a variety of other forms. Furthermore, various omissions, substitutions and changes in the form of the methods and systems described herein may be made without departing from the scope of protection.

Overview

Data storage cells in solid state drives (SSD), such as multi-level-per-cell (MLC) flash memory, may have distinct threshold voltage distribution ($V_t$) levels, corresponding to different memory states. For example, in an MLC implementation, different memory states in an SSD may correspond to a distribution of voltage levels ranging between voltage read levels; when the charge of a memory cell falls within a particular range, one or more reads of the page may reveal the corresponding memory state of the cell. The term "read" is used herein with respect to voltage reads of SSDs according to its broad and ordinary meaning, and may refer to read operations on a page, including a plurality of cells (e.g., thousands of cells), or may be used with respect to a voltage charge level of a single memory cell.

Voltage read levels can advantageously be set to values in the margins between memory states. According to their charge level, memory cells store different binary data representing user data. For example, based on its charge level, each cell generally falls into one of the memory states, represented by associated data bits. Performing cell reads at the various read levels can provide 1-bit input data for identifying the memory states with which certain cells are associated when the distributions for different states are tightly clustered and there is no overlap between them.

Over time, and as a result of various physical conditions and wear from repeated program/erase (P/E) cycles, the margins between the various distribution levels may be reduced, so that voltage distributions overlap to some extent. Such reduction in read margin may be due to a number of factors, such as loss of charge due to flash cell oxide degradation, over-programming caused by erratic program steps, programming of adjacent erased cells due to heavy reads or writes in the locality of the cell (or write disturbs), and/or other factors. When voltage distributions overlap, single-read inputs may not provide enough information to decode the original data.

Soft-decision inputs, such as log-likelihood ratios (LLRs), can enhance the probability of successful decoding in certain situations. However, in certain embodiments, SSDs are not configured to provide soft-decision data. For example, an SSD may present a binary interface, wherein the SSD returns binary data based on reads of the SSD at various voltage threshold levels. Such voltage threshold levels utilized by the SSD may be adjustable or configurable in certain configurations. In order to provide more reliable data input, it may be desirable for an SSD controller to generate soft-decision data based on binary return values provided by SSDs. Certain embodiments disclosed herein provide for soft-decision input generation for a decoding module, such as a low-density parity check (LDPC) decoder, using a multiple-read technique. Certain embodiments further provide systems and methods for SSD channel estimation, as well as optimal $V_t$ tracking for SSDs to improve utilization of the decoder correction capability.

"Page," or "E-page," as used herein may refer to the unit of data correction of embodiments disclosed herein. For example, error correction/calibration operations may be performed on a page-by-page basis. A page of data may be any suitable size. For example, a page may comprise 1 k, 2k, 4k, or more bytes of data. Furthermore, the term "location," or "memory location" is used herein according to its broad and ordinary meaning and may refer to any suitable partition of memory cells within one or more data storage devices. A memory location may comprise a contiguous array of memory cells or addresses (e.g., a page).

As used in this application, "non-volatile solid-state memory" may refer to solid-state memory such as NAND flash. However, the systems and methods of this disclosure may also be useful in more conventional hard drives and hybrid drives including both solid-state and hard drive components. Solid-state memory may comprise a wide variety of technologies, such as flash integrated circuits, Phase Change Memory (PC-RAM or PRAM), Programmable Metallization Cell RAM (PMC-RAM or PMCm), Ovonic Unified Memory (OUM), Resistance RAM (RRAM), NAND memory, NOR memory, EEPROM, Ferroelectric Memory (FeRAM), MRAM, or other discrete NVM (non-volatile solid-state memory) chips. The non-volatile solid-state memory arrays or storage devices may be physically divided into planes, blocks, pages, and sectors, as is known in the art. Other forms of storage (e.g., battery backed-up volatile DRAM or SRAM devices, magnetic disk drives, etc.) may additionally or alternatively be used.

System Overview

FIG. 1A is a block diagram illustrating an embodiment of a combination of a host system 110 with storage device 120 incorporating error management functionality. As shown, the storage device 120 includes a controller 130, which in turn includes an error management module 140A. In certain embodiments, the error management module 140A is configured to detect and correct certain kinds of internal data corruption of one or more non-volatile solid-state memory arrays 150. In one embodiment, the error management module 140A may include an encoder (e.g., an LDPC encoder) to encode data written to the memory array 150 and a decoder (e.g., an LDPC decoder) to decode data read from the memory array 150. In one embodiment, the error management module 140A is configured to generate LLRs for cells of the memory array 150 for soft-decision error correction.

In certain embodiments, the controller 130 is configured to receive memory access commands from a storage interface (e.g., driver) 112 residing on a host system 110. The controller 130 is configured to execute commands in response to such host-issued memory commands in the non-volatile solid-state memory arrays 150. Data may be accessed/transferred based on such commands. In one embodiment, the storage device 120 may be a hybrid disk drive that additionally includes magnetic memory storage (not shown). In such case one or more controllers 130 would control the magnetic memory storage and the non-volatile solid-state memory array(s) 150.

FIG. 1B is a block diagram illustrating an embodiment of an error management module 140B, which may correspond to the error management module 140A shown in FIG. 1A. In certain embodiments, the error management module 140B includes a soft-decision input generator 142 for generating soft decision input that may be used by a decoder module 149. The soft-decision input generator 142 may be configured to quantize binary inputs to multiple-bit values, which may be used to provide multiple-bit input to the decoder 149. Therefore, the soft-decision input generator 142 may be configured to emulate soft-decision input using binary values. In certain embodiments, soft-decision decoding provides improved performance with respect to comparable hard decision decoding techniques.

The error management module 140B includes a calibration module 144 as well as one or more indexes for storing look-up tables (LUTs) containing possible soft-decision input values. The error management module 140B may further include a module (not shown) for tracking voltage threshold levels for determining relative optimal voltage threshold levels. For example, the voltage threshold tracking module may report one or more E-page reads having minimum bit-flip error counts from among a plurality of E-page reads associated with different voltage read levels. For example, a page A may be read three times at different voltage read levels, resulting in three read copies $A_1$, $A_2$, and $A_3$ and the tracking module may find that $A_1$ results in the fewest bit-flip error as compared the decoded page A.

The error management module 140B may be configured to perform soft-decision calibration using the calibration module 144, wherein possible LLR values are stored by the calibration module 144 in one or more local and/or remotely-stored LUTs, which can be used by the error management module 140B for decoding target data as needed. When a target page cannot be decoded using hard-decision input, the appropriate LUT may be provided to the soft-decision input generator with the target data. Calibration may be performed periodically using a background process, and may be performed on a per-block, or per-die basis. For example, a calibration can be performed based on a reference page within each of blocks $B_1, B_2, \ldots, B_N$. If a read on a page (the target page) in block $B_3$ encounters an error, then the soft-decision data based on calibration on the reference page within $B_3$ can be used to help decode that target page in block $B_3$. For example, calibration may performed according to a firmware-based schedule, which may dictate calibration on a daily, weekly, monthly, or other basis.

The calibration module 144 is configured to generate possible LLR values based on one or more reads of a reference memory location and comparison of such read values with known reference values stored in the reference memory location. The calibration module 144 may further populate one or more LUTs 148 with the generated LLR values. The LLR values stored in the LUT(s) may be used by the error management module 140B as inputs to the decoder 149 in association with the decoding of target memory locations related to the reference location. In addition to the index 148, one or more indexes/LUTs may be stored externally to the error management module 140B. For example, multiple LUTs, each associated with different reference locations may be stored externally. When the error management is tasked with decoding a particular target location, the LUT associated with the corresponding reference location may be accessed and used by the error management module 140B to provide soft-input values to the decoder 149. LUTs may be any suitable size. For example, in certain embodiments, LUTs have dimensions of n×m, wherein n may correspond to the maximum number of multi-reads supported +1 and m may correspond to the bit width of the LLR, which in one embodiment is equal to the decoder's internal precision. In one embodiment, the dimension used is 8×8.

The calibration module 144 may include functionality for performing certain statistical analysis for 1-read and/or multiple-read decoding operations. For example, such statistical analysis may include determining one or more of the following: total bit-error count, 1-to-0 flip count, and 0-to-1 flip count, wherein total bit-error count is the sum of 1-to-0 and 0-to-1 flip counts. The calibration module 144 may make such determinations based at least in part on LLR input values stored in the index 148, as well as information from the decoder 149. In certain embodiments, the calibration module 144 determines which among a plurality of voltage level reads of a location has the minimum total bit-error count. The corresponding voltage read level may be considered the optimal read level for the location.

Figure 2:
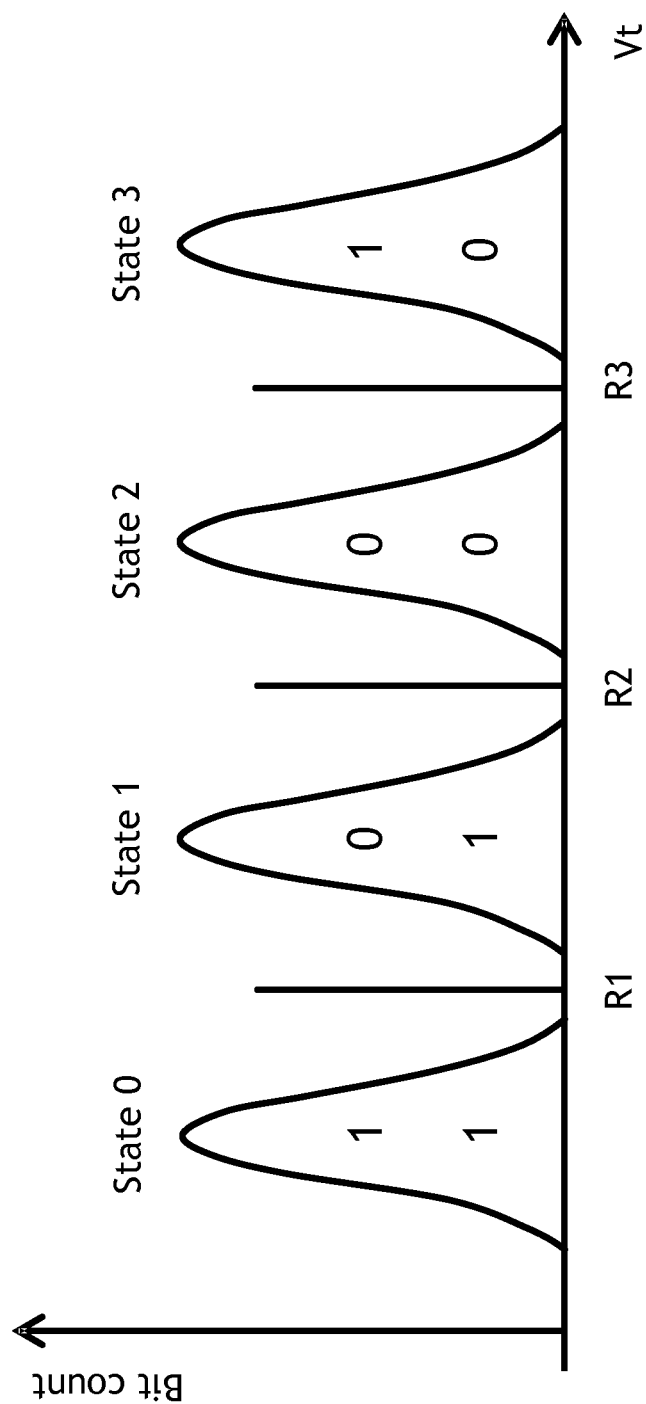
FIG. 2 is a graph showing a probability distribution of cells in a non-volatile solid-state memory array according to one embodiment.

FIG. 2 is a graph showing a probability distribution of cells in a non-volatile solid-state memory array according to one embodiment. Flash memory, such as multi-level cell (MLC) NAND flash memory, may store two or more bits of information per cell. While certain embodiments disclosed herein are described in the context of MLCs, it should be understood that the concepts disclosed herein may be compatible with single level cell (SLC), three-level cell (TLC) technology (a type of MLC NAND), and/or other types of technology. Data is generally stored in MLC NAND flash memory in binary format. For example, two-bit-per-cell memory cells can have 4 distinct voltage ($V_t$) levels, and 3-bit-per-cell memory cells can have 8 distinct $V_t$ levels, and so on. According to their $V_t$, and the coding associated with their $V_t$, memory cells store different binary bits.

The horizontal axis depicted in FIG. 2 represents cell voltage level. The vertical axis represents the number of cells that have the corresponding voltage values. Thus, the four distribution curves represent the number of cells, broken down by the four distributions, which have the corresponding voltage values. As shown, the voltage distribution of the memory cells may include a plurality of distinct levels, or states (e.g., States 0-3 in this example 2-bit-per cell MLC configuration, as shown). Read reference values (i.e., voltage threshold levels R1-R3) may be placed between these levels. The gap between the levels (i.e., margin between programmed states), in which the read voltage references may advantageously be positioned in certain embodiments, is referred to as "read margin."

Over time, and as a result of various physical conditions and wear, for example from being subjected to repeated P/E cycles, the read margins between the various distribution levels may be reduced, resulting in both data retention problems and higher read errors beyond certain limits. Such reduction in read margin may be due to a number of factors, such as loss of charge due to flash cell oxide degradation, over-programming caused by erratic program steps, programming of adjacent erased cells due to heavy reads or writes in the locality of the cell (or write disturbs), and/or other factors.

While the diagram of FIG. 2 illustrates a $V_t$ distribution for 2-bit-per-cell flash memories, embodiments and features disclosed herein may be applicable to other types of coding schemes. With respect to the embodiment of FIG. 2, the coding for States 0-3 can be, for example, '11,' '01,' '00,' and '10,' or any other coding. Each cell may generally fall into one of the illustrated states and correspondingly represents two bits. For one word line (WL), which can be connected to tens of thousands of cells in a NAND array, the lower digit of the cells may be referred to as the "lower page," and the upper digit may be referred to as the "upper page." For 3-bit-per-cell flash memories, there may also be intermediate digits, which may be referred to as "middle pages." Reading voltage levels and operations are dependent on the coding of these states. For example, for the coding as shown in FIG. 2 for the 2-bit-per-cell flash memories, one read at R2 may be required to read out the lower page, and two reads at both R1 and R3 may be required to read out the upper page. As shown in the distribution of FIG. 2, these reading voltages may be selected between state distributions in the case where the distributions for different states are narrow so that there is no overlap between them.

Soft Decision Input Generation—Scaled Approach

With further reference to FIG. 1B, the soft-decision input generator 142 may be configured to generate soft-decision inputs based on a single read of a memory location, wherein multiple-bits of information are generated based on a single binary value. In such a configuration, binary values returned by memory arrays may be up-scaled in order to generate the appropriate number of bits. For example, binary values of 0 and 1 may be up-scaled by a scale factor corresponding to the internal bit-width of the decoder.

Figure 3:
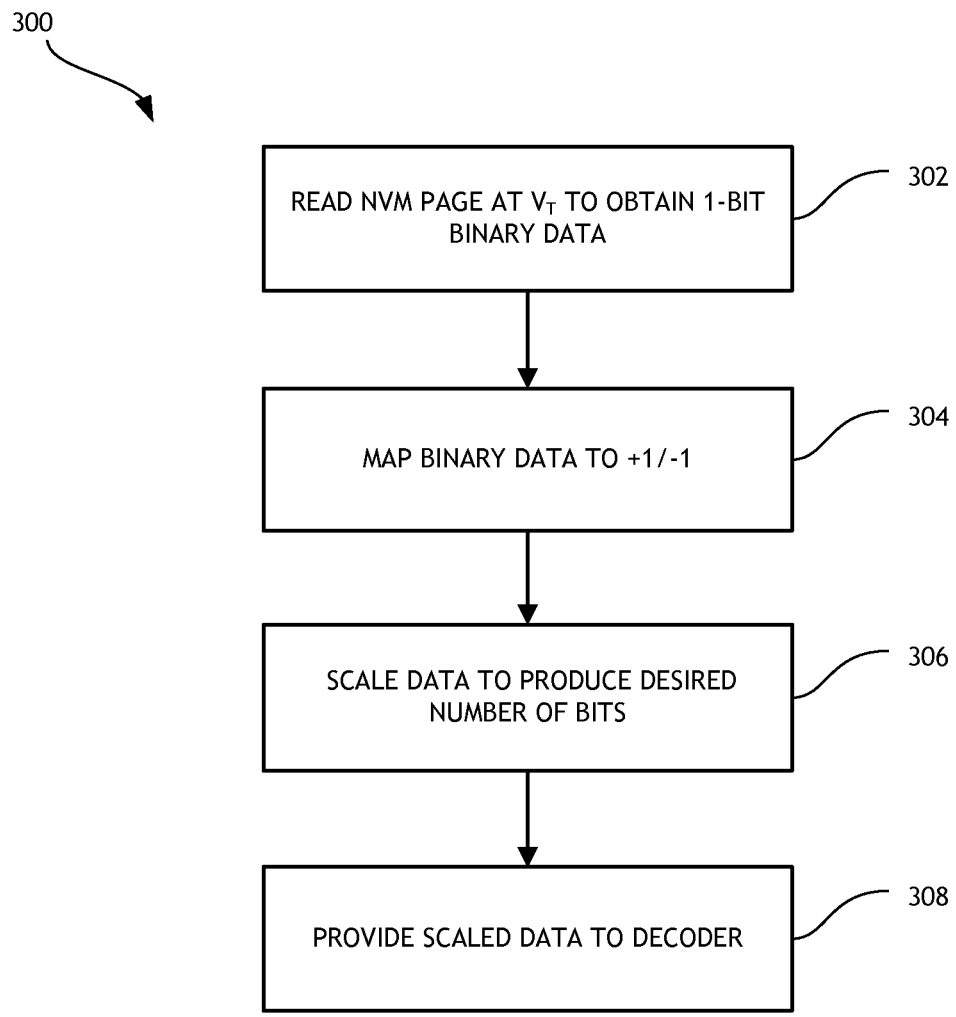
FIG. 3 is a flow diagram for an embodiment of a 1-read soft-decision input generation process.

FIG. 3 is a flow diagram for an embodiment of a 1-read soft-decision input generation process 300. The process 300 includes reading a target page at a predetermined voltage threshold level to obtain a 1-bit binary data value at block 302. In certain embodiments, the 1-bit values are mapped to the values +1 and −1 at block 304. For example, a binary value of '0' may be mapped to −1, while the binary value of '1' may be mapped to +1. The values are then scaled up by a certain scale factor in order to generate the desirable number of bits of data for use by the relevant decoder, such as an LDPC decoder. By such procedure, each 1-bit data value may be converted to an n-bit value, where n is the internal bit-width of the decoder core.

Soft Decision Input Generation—Multi-Read Approach

Figure 4:
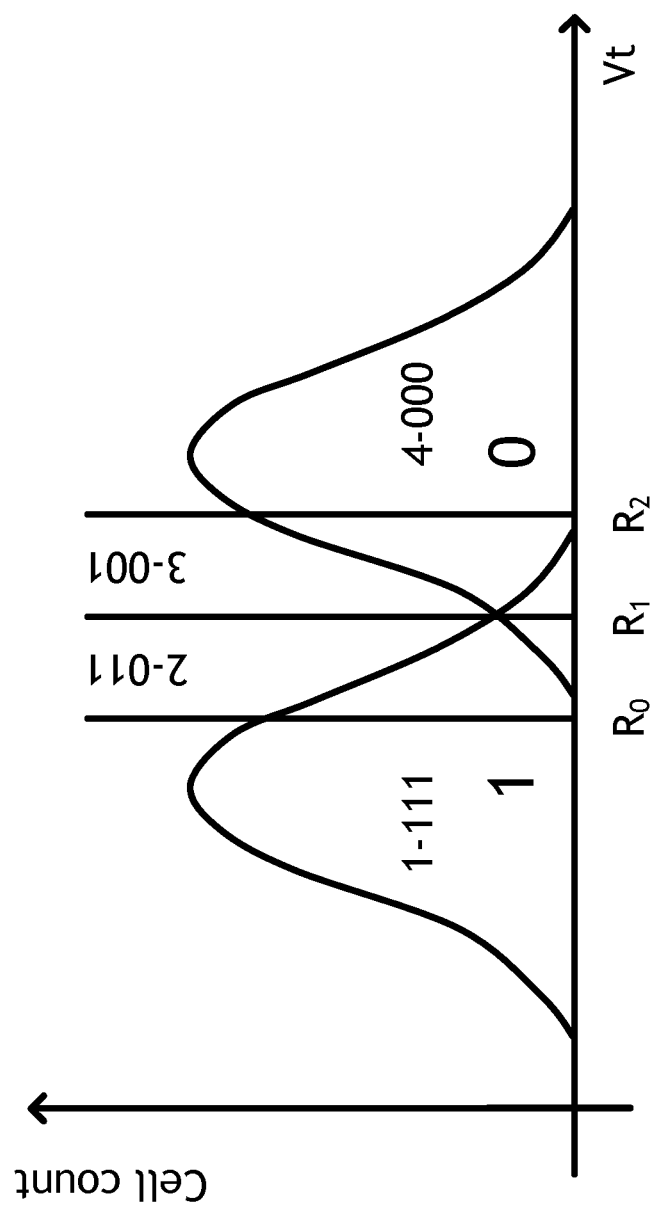
FIG. 4 is a graph showing a probability distribution of cells in a non-volatile solid-state memory array according to one embodiment.

Single-read soft-decision input generation may not provide sufficient or desirable information for certain purposes. Therefore, certain embodiments disclosed herein provide a soft-decision input generator that is configured to generate soft-decision inputs based on multiple reads of a memory location, thereby providing multiple bits of data from which to generate soft-decision inputs. FIG. 4 is a graph showing a probability distribution of cells in a non-volatile solid-state memory array illustrating a multiple-read scheme. As discussed above, due to the memory wearing out, loss of data retention, and the like, the states of a voltage distribution can widen and overlap. Reading at a single read voltage (e.g., $R_1$) may not be enough to decode the original data, as one or more of the probability distributions cross over the read level. Therefore, utilizing certain ECC schemes, such as, single-read LDPC, may be insufficient to correctly decode the data. Although multiple-read schemes may be computationally complex and time-consuming, multiple reads can provide increased performance in certain situations with respect to single-read solutions.

In the multiple-read scheme illustrated in FIG. 4, three reads are involved, with reading voltages at $R_0$, $R_1$, and $R_2$. These three reading voltages divide the distribution shown into four zones (e.g., zones 1-4, from left to right). Although three reading voltages are illustrated in FIG. 4, certain embodiments may include more than three reading voltages, such that the distribution may be divided into more than four zones. For example, 4, 5, 6, 7 or more reads may be taken in association with a junction between memory states. Flash cells having charge levels in the different zones may return different values corresponding to the respective zone. For example, in certain embodiments, flash cells read having a charge level within zone 1 may return '1' for each of the three reads, thereby providing three bits of information ('111'); cells read having a charge level within zone 2 return '011'; cells read having a charge level within zone 3 return '001'; and cells read having a charge level within zone 4 return ('000'). If the data are known, the LLRs for these 4 groups of number combination may be obtained. For example, if there are a total of N cells in zone 1, among which the real values of m cells are 0, LLRs can be determined using the following equation: LLR(111)=log(m/N-m). Although FIG. 4 shows three reads and four zones, more reads and zones are possible in other embodiments, and the LLRs may be generated in a similar manner to that described above.

Figure 5A:
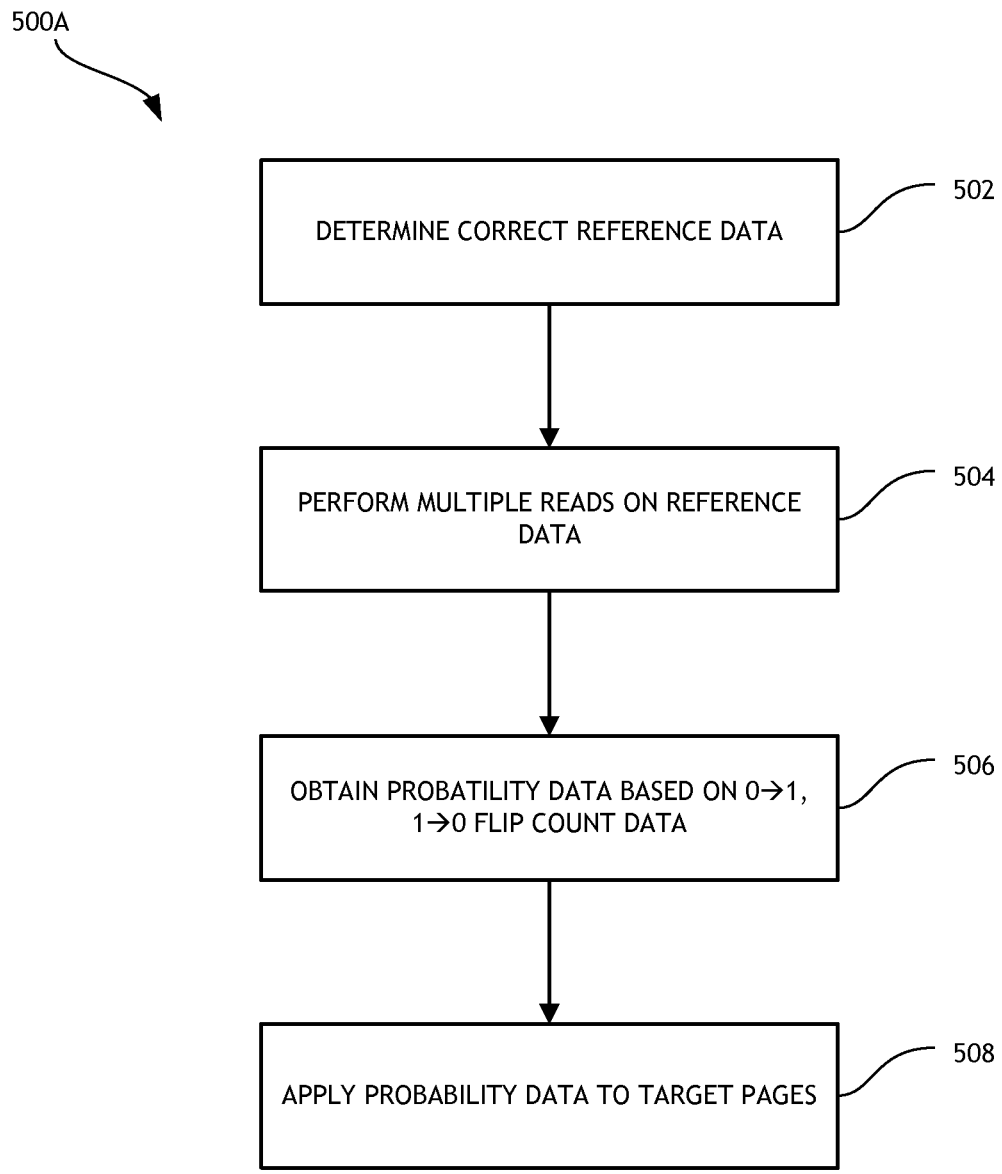
FIG. 5A is a flow diagram illustrating an embodiment of a process of generating soft-decision LLR inputs using multiple reads.

FIG. 5A is a flow diagram illustrating an embodiment of a process 500A of generating soft-decision LLR inputs using multiple reads. The process 500A is described with reference to FIG. 1B for illustrative purposes, and may be performed by the error management module 140B of FIG. 1B. In one embodiment, the process begins at block 502 where correct reference data is determined. Then in block 504, multiple reads with different voltage thresholds are performed on the reference data. In block 506, probability data are obtained based on comparison of bit flip count data. In block 508, the obtained probability data are applied to decode target memory location(s). During decoding of a memory location, read errors may be encountered and soft-decision data may be used for decoding data stored in the memory location. Therefore, in certain embodiments, part of the process 500A (e.g., block 508) is performed after hard-decision error correction fails with respect to one or more target memory locations. Other parts of the process 500A may be performed periodically, apart from the occurrence of a failure to hard-decision error correction.

Figure 5B:
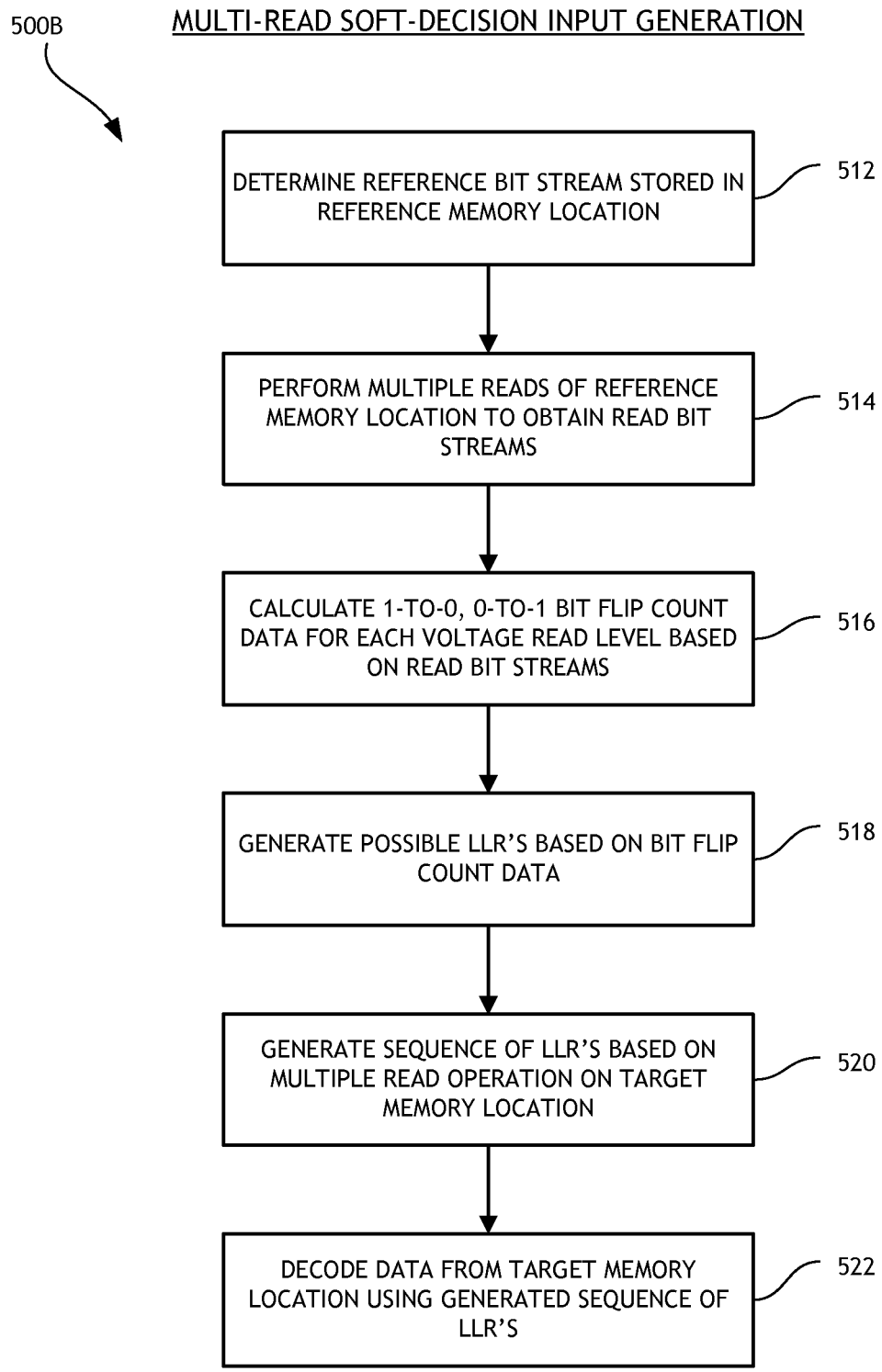
FIG. 5B is a flow diagram illustrating an embodiment of a process of generating soft-decision LLR inputs using multiple reads.

FIG. 5B is a flow diagram illustrating another embodiment of a process 500B of generating soft-decision LLR inputs using multiple reads. The process 500B includes determining a known reference bit stream recorded in a reference memory location at block 512 and performing a plurality reads of the reference location at a plurality of voltage read levels to obtain streams of bits corresponding to each of the reads (block 514). The process 500B may further include calculating 1-to-0 and 0-to-1 bit flip count data for each voltage read level based on the bit streams (block 516). Possible LLR values are generated at block 518 based on the bit flip count data. At block 520 a sequence of LLRs based at least in part on the possible LLRs and on bit patterns from a multiple read operation on the target memory location is generated and data from a target memory location is decoded using the generated sequence of LLRs.

Multi-Read Approach—Determine Correct Reference Data

The process 500A includes determining correct reference data at block 502, while the process 500B includes determining a known reference bit stream recorded in a reference memory location at block 512. Such reference data may provide a basis for calibration of the soft-decision input generator 142 of FIG. 1B. For example, in certain embodiments, calculated possible LLR values are based on a reference memory location, or known channel, wherein the LLR values are applicable to target memory locations sharing one or more data retention characteristics of the reference location. For example, the reference memory location may have experienced similar environmental conditions, age and/or read/write cycling as the target location(s). The reference location may be located in physical proximity to target locations that are decoded based on analysis of the reference location. In certain embodiments, target locations are located within the same block of data as the reference location. That the reference location has similar device usage history to target locations can be important so that the information collected from the reference location can at least partly reflect the retention variables experienced by the related locations closely enough such that the reference location can be considered a valid reference with respect to the related memory locations.

Determining the correct reference data may include determining a bit stream stored in the reference memory location for reference during calibration of the soft-decision input generator 142. Any suitable or desirable mechanism for determining the correct value of the reference bit stream may be used. For example, the reference memory location may be assigned by the system prior to calibration of the soft-decision input generator 142, and may be pre-programmed with a known bit stream.

Alternatively, in certain embodiments, the reference location does not contain a pre-programmed known bit stream. Instead, the reference bit stream may be determined by decoding the data in the reference location during calibration, as will be further explained below with respect to FIG. 6. In certain embodiments, the error management module 140B is configured to decode the reference memory location using hard-decision techniques. If a selected reference location is not able to be decoded correctly using hard-decision techniques, the calibration module 144 may be configured to select a different memory location to serve as the relevant reference location.

Figure 6:
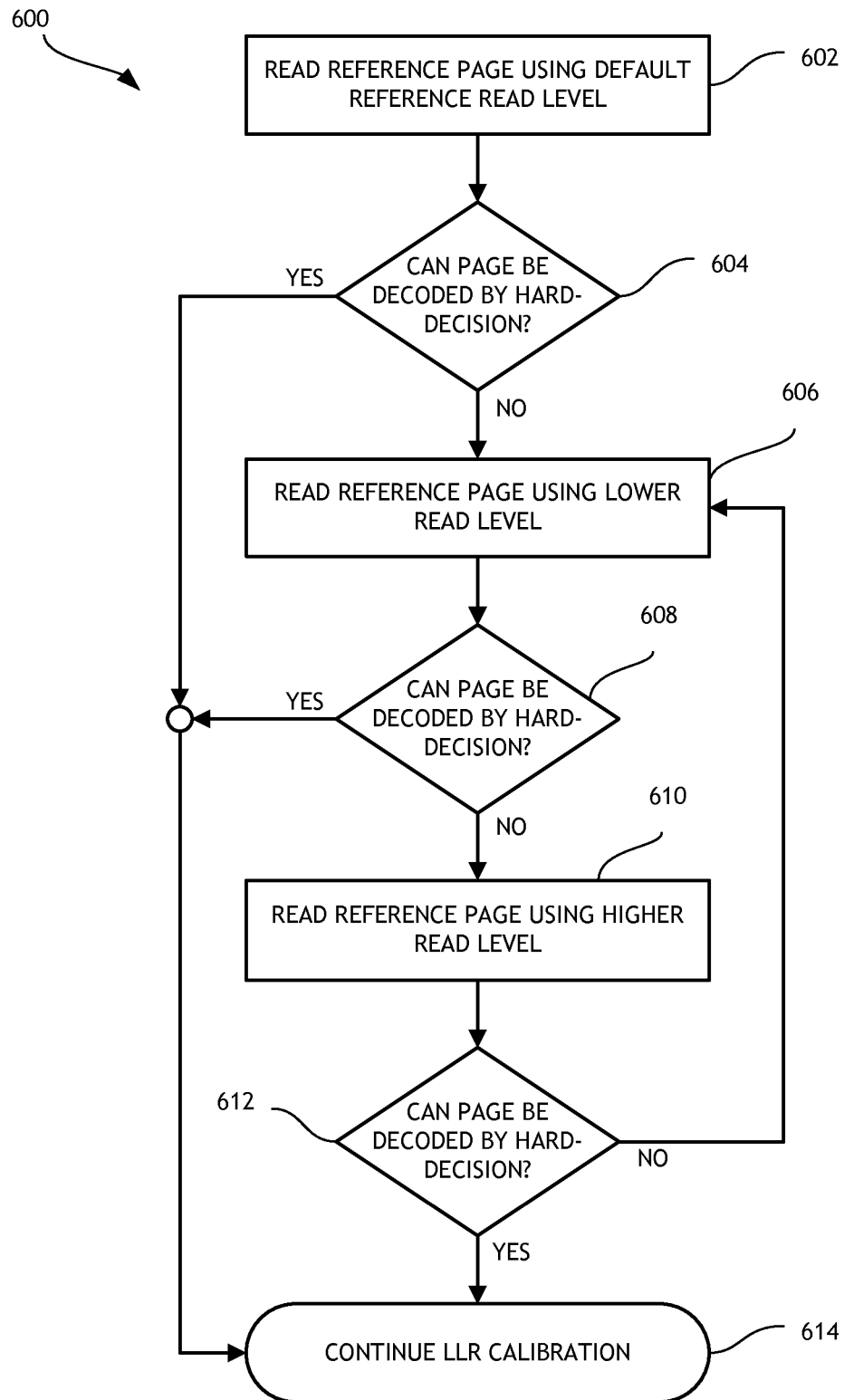
FIG. 6 is a flow chart illustrating an embodiment of a process for decoding a reference bit stream using hard-decision input.

FIG. 6 is a flow chart illustrating an embodiment of a process 600 for decoding a reference bit stream using hard-decision input, which may be performed as an initial, or early, stage of calibration (e.g., as part of block 502 in FIG. 5A or block 512 in FIG. 5B). The process 600 includes reading the reference memory location/page using a default voltage read level. For example, in a 3-read scheme, the default read level may correspond to the intermediate read level. At block 604 it is determined whether the page can be decoded using the default read level to provide hard-decision input. If so, then the process 600 is complete, as the reference page can therefore be correctly decoded. If the page cannot be decoded using hard-decision input, the process 600 includes attempting to decode the page using higher and/or lower voltage read levels, wherein the process 600 terminates upon successful decoding. In certain embodiments, the process 600 loops until the page can be decoded successfully using hard-decision input. Upon completion of the process 600, further calibration steps may be performed, as discussed herein.

Multi-Read Approach—Perform Multi-Read on Reference Data

With further reference to FIG. 5A, once the reference bit stream stored in the reference memory location has been determined, the process 500A includes performing multiple reads on the reference data at block 504. Similarly, in FIG. 5B, in block 514 the process 500B performs a plurality reads of the reference location at a plurality of voltage read levels to obtain streams of bits corresponding to each of the reads. Such reads may be performed in order to generate a plurality of bit streams corresponding to values returned in connection with the plurality of reads.

Once the multiple reads are completed, the process 500A includes calculating LLR values based determining the bit flip counts of each of the multiple reads through comparisons of the multiple-read values to the correct reference data at block 506. For example, each of the reads of the reference location can be compared to the known reference data to determine how many of the cells are flipped from '0' to '1,' and vice versa. Table A shows example bit streams obtained through reads of a reference memory location at three different read voltage levels ($R_0$, $R_1$, $R_2$). The top row of bits reflects the correct data stored in the reference memory location. The three voltage read levels may illustratively correspond to those shown in FIG. 4, wherein the three voltage read levels divide the relative distribution spectrum into four zones represented by 3-bit bit patterns.

TABLE A

| Reference E-Page Bit Stream | | | | | | |
|---|---|---|---|---|---|---|
| Correct Data | 0 | 1 | 0 | 0 | 1 | 0 |
| $R_0$ | 0 | 1 | 0 | 0 | 0 | 0 |
| $R_1$ | 0 | 1 | 1 | 1 | 1 | 0 |
| $R_2$ | 1 | 1 | 1 | 1 | 1 | 0 |

While the table shows 6-bit bit streams in each of the rows, such bit stream size is provided for illustration purposes only, and a given memory location of interest may be significantly larger, comprising thousands of bits or more, for example. Furthermore, more than three reads may be used, or two reads may be used. Calibrating the soft-decision input generator using the data of Table A may include determining the following bit flip counts with respect to the correct reference data: (1) the 0-to-1 bit flip count at $R_0$; (2) the 1-to-0 bit flip count at $R_0$; (3) the 0-to-1 bit flip count at $R_1$; (4) the 1-to-0 bit flip count at $R_1$; (5) the 0-to-1 bit flip count at $R_2$; and (6) the 1-to-0 bit flip count at $R_2$. With respect to the 6-bit example shown in Table A, the values of each of the six calculated data point would be: (1)=0, i.e., no bits flipped from '0' to '1' for $R_0$; (2)=1 (bit five is flipped from '1' to '0' for $R_0$); (3)=2 (bits three and four are flipped from '0' to '1' for $R_1$); (4)=0; (5)=3 (bits one, three and four are flipped from '0' to '1' for $R_2$); and (6)=0. In embodiments including more or fewer reads, the number of bit flip counts calculated may be different. Generally, the number of data points calculated is approximately equal to 2×M, where M is the number of reads at different voltage levels.

Multi-Read Approach—Calculate LLR Values

Figure 7:
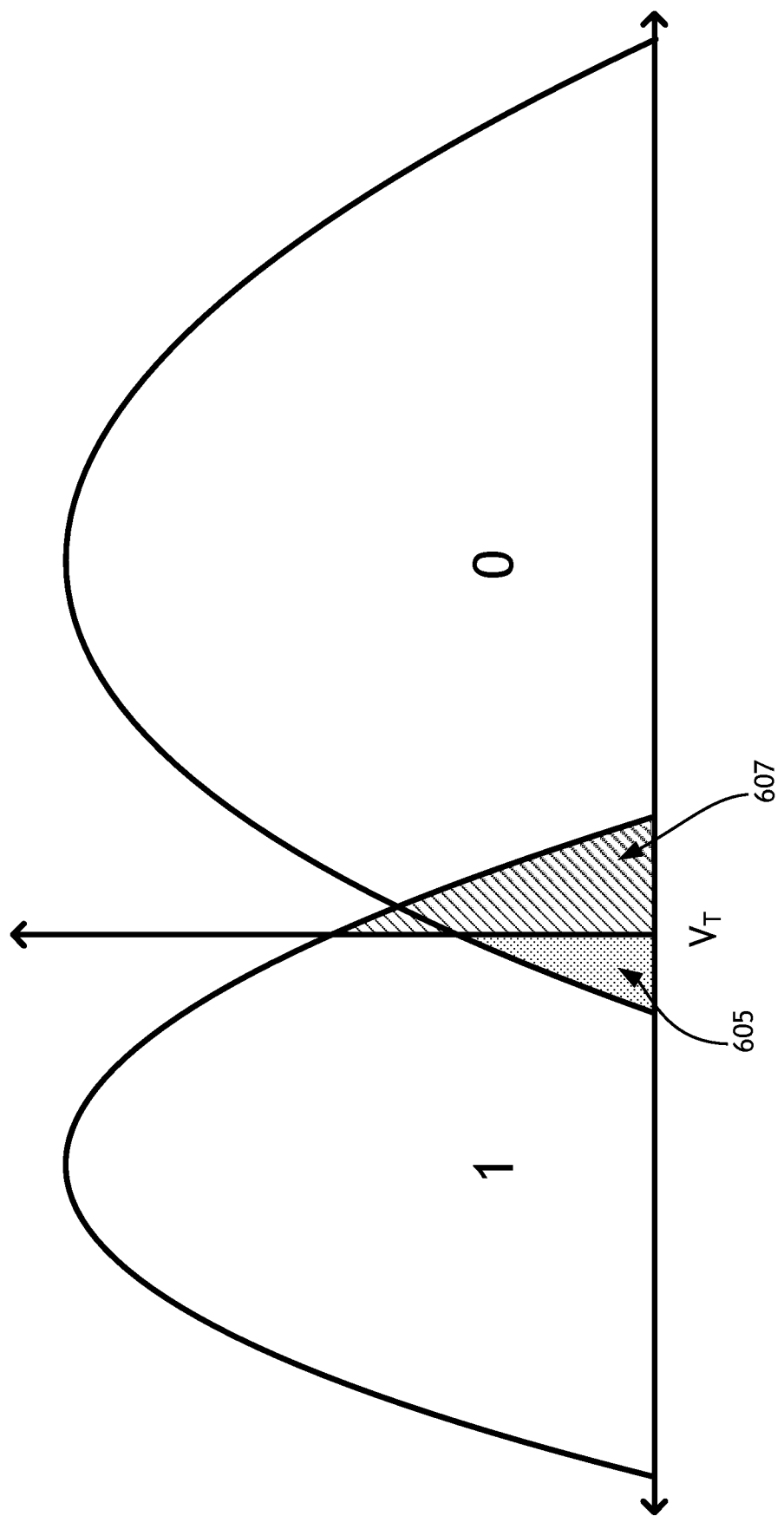
FIG. 7 provides an embodiment of a cell probability distribution graph.

Certain embodiments disclosed herein provide for probability data (e.g., LLR) calculation based on calculated 1-to-0 and 0-to-1 bit flip counts. This may correspond to in block 506 in FIG. 5A in one embodiment, and to blocks 516 and 518 of in FIG. 5B in another embodiment. FIG. 7 provides a cell probability distribution graph that may be helpful in illustrating the application of bit flip counts to LLR calculation algorithms. In the distribution of FIG. 7, a '1' distribution and a '0' distribution overlap in a region of the voltage spectrum. In an example embodiment, a page is read at a voltage read level $V_T$, as shown. With respect to a read of the page at $V_T$, the area 605 of the '0' distribution represents the number of originally-programmed '0' cells that have flipped to '1,' whereas the region 607 represents the number of originally-programmed '1' cells that have flipped to '0.' In certain embodiments, it is assumed that the occurrences of 0/1 in the reference bit stream is randomized such that the number of 0's and 1's is approximately equal. Therefore, the variable 0_px, which is used herein to refer to the probability that a '0' in the reference bit stream has flipped to '1' at voltage read level $V_{Tx}$, as well as the probability that a '1' in the reference bit stream has flipped to '0,' can be represented as follows:

$$0\_px = \frac{0\_to\_1(VTx)}{total\_correct\_0\_bits} \cong \frac{0\_to\_1(VTx)}{0.5 * total\_bits}$$

$$1\_px = \frac{1\_to\_0(VTx)}{total\_correct\_1\_bits} \cong \frac{1\_to\_0(VTx)}{0.5 * total\_bits}$$

With reference to FIG. 1B, the calibration module 144 may be configured to determine the 1-to-0 and 0-to-1 flip count in the decoder 149 after decoding procedure is done. As shown in FIG. 7, 1-to-0 count represents the integrated probability that '1' is flipped to '0' when the reference threshold is at $V_T$, while the 0-to-1 count represents the integrated probability that '0' is flipped to '1' when the reference threshold is at $V_T$. Furthermore, 1-to-0 or 0-to-1 counts may represent the value in the cumulative distribution function (CDF).

The LLR (Log Likelihood Ratio) may be defined as ln $$\left(\frac{P(0)}{P(1)}\right),$$

where P(0) is the probability that a transmitted bit is a '0' value, while P(1) is the probability that the transmitted bit has a value of '1.' It may therefore be convenient to use bit counts directly since the relevant probabilities are proportional to the count number. Based on Bayes' theorem, $P(0)=Pr(c_i=0|y_0(i), y_1(i), \ldots y_{m-1}(i))=Pr(y_0(i), y_1(i), \ldots y_{m-1}(i))|c_i=0)*Pr(c_i=0)/Pr(y_0(i), y_1(i), \ldots y_{m-1}(i))=K*Pr(y_0(i), y_1(i), \ldots y_{m-1}(i))|c_i=0)$.

With respect to the distribution graph of FIG. 7, for a cell associated with a returned value of '1' from a voltage read at $V_T$, the value of P(0) may be represented by the area 605 divided by the sum of the area of the '1' distribution on the left side of $V_T$ (i.e., not including the area of the region 607) plus the area 605. Therefore, as the areas 605 and 607 are provided by calculating the 1-to-0 and 0-to-1 bit flip counts, such counts can be used to calculate LLR values according to the LLR equation in the preceding paragraph.

Figure 8:
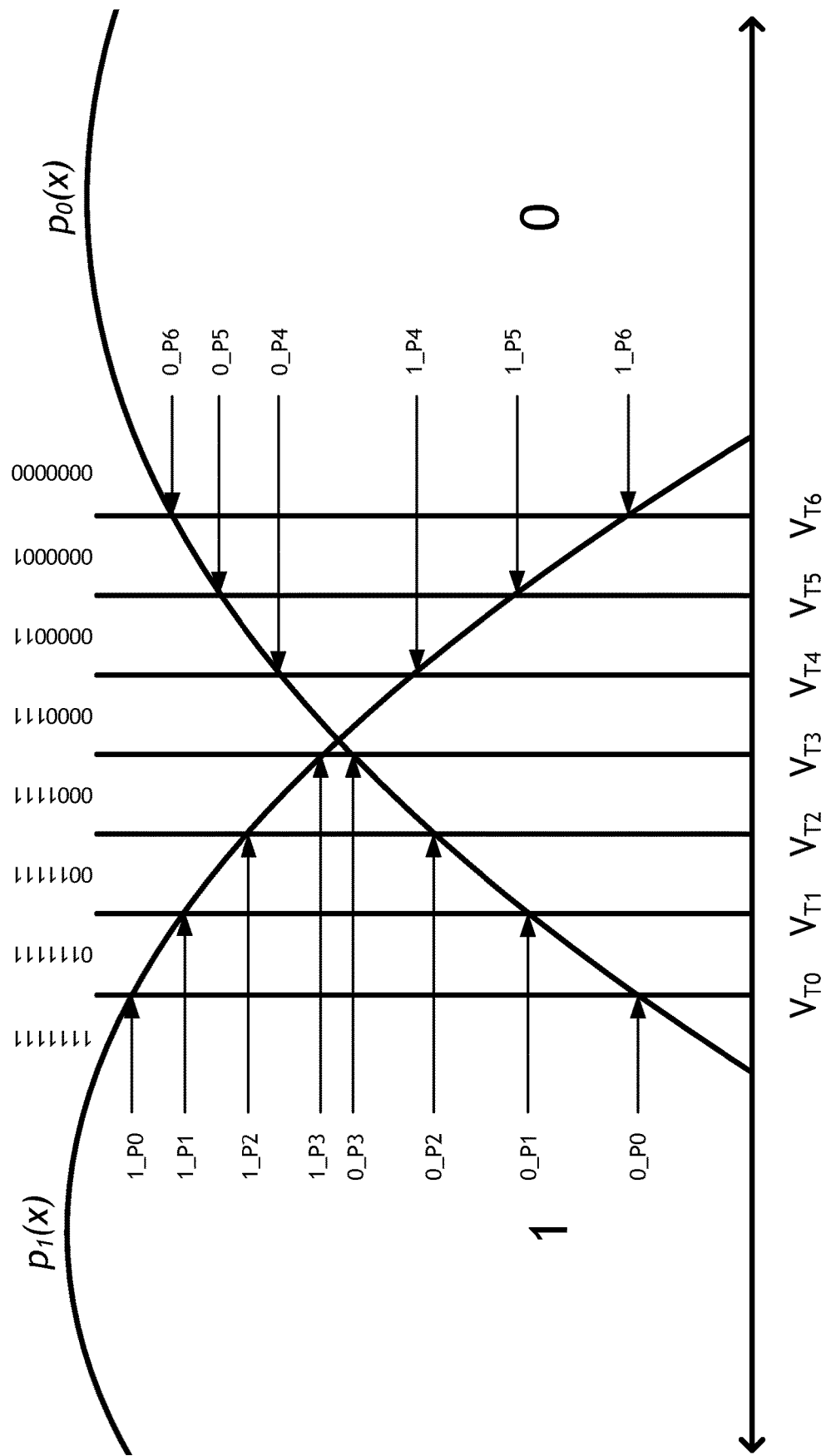
FIG. 8 provides an embodiment of a cell probability distribution graph for a multiple-read embodiment.

In a multiple-read scheme, the LLR calculations may be somewhat more complex. FIG. 8 provides a cell probability distribution graph for a multiple-read embodiment. As defined above, the bit flip counts of the form Y_px shown in the graph are defined to represent the probability that a reference bit having an original value of 'Y' has flipped when read at a voltage read level $V_{Tx}$. Table B provides a mathematical representation of the values of each of the variables identified in the graph:

TABLE B

LLR Calibration Algorithm Based on Probability Density Function $$1\_p0 = \int_{+\infty}^{V_{T0}} p_1(x)\,dx \qquad 0\_p0 = \int_{-\infty}^{V_{T0}} p_0(x)\,dx$$

$$1\_p1 = \int_{+\infty}^{V_{T1}} p_1(x)\,dx \qquad 0\_p1 = \int_{-\infty}^{V_{T1}} p_0(x)\,dx$$

$$1\_p2 = \int_{+\infty}^{V_{T2}} p_1(x)\,dx \qquad 0\_p2 = \int_{-\infty}^{V_{T2}} p_0(x)\,dx$$

TABLE B-continued

LLR Calibration Algorithm Based on Probability Density Function $$1\_p3 = \int_{+\infty}^{-V_{T3}} p_1(x)\,dx \qquad 0\_p3 = \int_{-\infty}^{-V_{T3}} p_0(x)\,dx$$

$$1\_p4 = \int_{+\infty}^{-V_{T4}} p_1(x)\,dx \qquad 0\_p4 = \int_{-\infty}^{-V_{T4}} p_0(x)\,dx$$

$$1\_p5 = \int_{+\infty}^{-V_{T5}} p_1(x)\,dx \qquad 0\_p5 = \int_{-\infty}^{-V_{T5}} p_0(x)\,dx$$

$$1\_p6 = \int_{+\infty}^{-V_{T6}} p_1(x)\,dx \qquad 0\_p6 = \int_{-\infty}^{-V_{T6}} p_0(x)\,dx$$

Where $p_1(x)$ and $p_0(x)$ are possibility density functions. Furthermore, it holds true that:

$$1 = \int_{+\infty}^{V_{-\infty}} p_1(x)\,dx$$

$$\text{And } 1 = \int_{-\infty}^{V_{+\infty}} p_0(x)\,dx$$

Although FIG. 8 illustrates a 7-read scheme, the principles described herein may be applicable to any suitable number of reads. With respect to the 7-read embodiment illustrated, the LLR equations for each of the zones shown and represented by 7-bit values may be as follows:

LLR(0000000)=$C^*\log_2((1-0\_p6)/1\_p6)$;

LLR(0000001)=$C\log_2((0\_p6-0\_p5)/(1\_p5-1\_p6))$;

LLR(0000011)=$C\log_2((0\_p5-0\_p4)/(1\_p4-1\_p5))$;

LLR(0000111)=$C\log_2((0\_p4-0\_p3)/(1\_p3-1\_p4))$;

LLR(0001111)=$C\log_2((0\_p3-0\_p2)/(1\_p2-1\_p3))$;

LLR(0011111)=$C\log_2((0\_p2-0\_p1)/(1\_p1-1\_p2))$;

LLR(0111111)=$C\log_2((0\_p1-0\_p0)/(1\_p0-1\_p1))$;

LLR(1111111)=$C\log_2((0\_p0)/(1-1\_p0))$;

C is a constant, which may be used to convert the $\log_2(x)$ to $\ln(x)$ and/or other scaling purposes. These values may serve as the content of the associated LLR LUT(s). The thresholds of $V_T$ are arranged from low to high. If the $V_T$ order is changed, the order of bit value representations (e.g., 0000000, 0000001, 0000011, etc.) may have to be changed as well.

These calculated possible LLR values may be used to populate one or more LUTs, as described above. Furthermore, the system may be configured to dynamically update LUT entries based on ongoing calibration/decoding operations. In certain MLC embodiments, memory cells comprise upper and lower pages of data, wherein separate LUTs are generated for upper and lower page values. When reading upper page values, the controller 130 (FIG. 1A) may reference lower page data in order to distinguish between read levels R1 and R3, as illustrated in FIG. 2.

Multi-Read Approach—Apply LLR Values to Target Memory Location(s)

With further reference to FIG. 5A, at block 508 of the process 500A, the recorded possible LLR values are applied to decode additional target memory locations that are determined to have retention characteristics similar enough to those of the reference memory location that similar bit pattern probability characteristics can be assumed. For example, when the error management module 140B is unable to decode a memory location/page using hard-decision input, the error management module 140B identifies the LUT(s) associated with such location, looks up the bit patterns that occur based on multiple reads of the memory location, and provides a sequence of LLR values associated with the bit patterns in the LUT(s). In some embodiments, at least a portion of the possible LLR values generated from block 506 is selected at block 508 and applied to the decoding of the target memory location. For example, given this lookup table (LUT) of possible LLR values:

| Bit Pattern | LLR Value |
| --- | --- |
| 000 | V0 |
| 001 | V1 |
| 011 | V2 |
| 111 | V3 | and three reads of a target page with the following bits returned, LLR value will be selected by matching each bit pattern to the lookup table. For example, the first bit pattern is "000" (three reads of the first cell of the page) which returns the LLR value of $V_1$. The pattern "010" may be considered an illegal state and is mapped one of the values of the lookup table.

| | | | | | | |
| --- | --- | --- | --- | --- | --- | --- |
| E0 | 0 | 0 | 1 | 0 | 0 | ... |
| E1 | 0 | 0 | 1 | 1 | 1 | |
| E2 | 1 | 0 | 1 | 1 | 0 | |
| LLR value | V1 | V0 | V3 | V2 | V2 | |

Similarly in FIG. 5B, at block 520 a sequence of LLRs based at least in part on the possible LLRs (from block 518) and on bit patterns from a multiple read operation on the target memory location is generated and data from a target memory location is decoded using the generated sequence of LLRs.

Bit Flip Count Interpolation/Extrapolation

Figure 9:
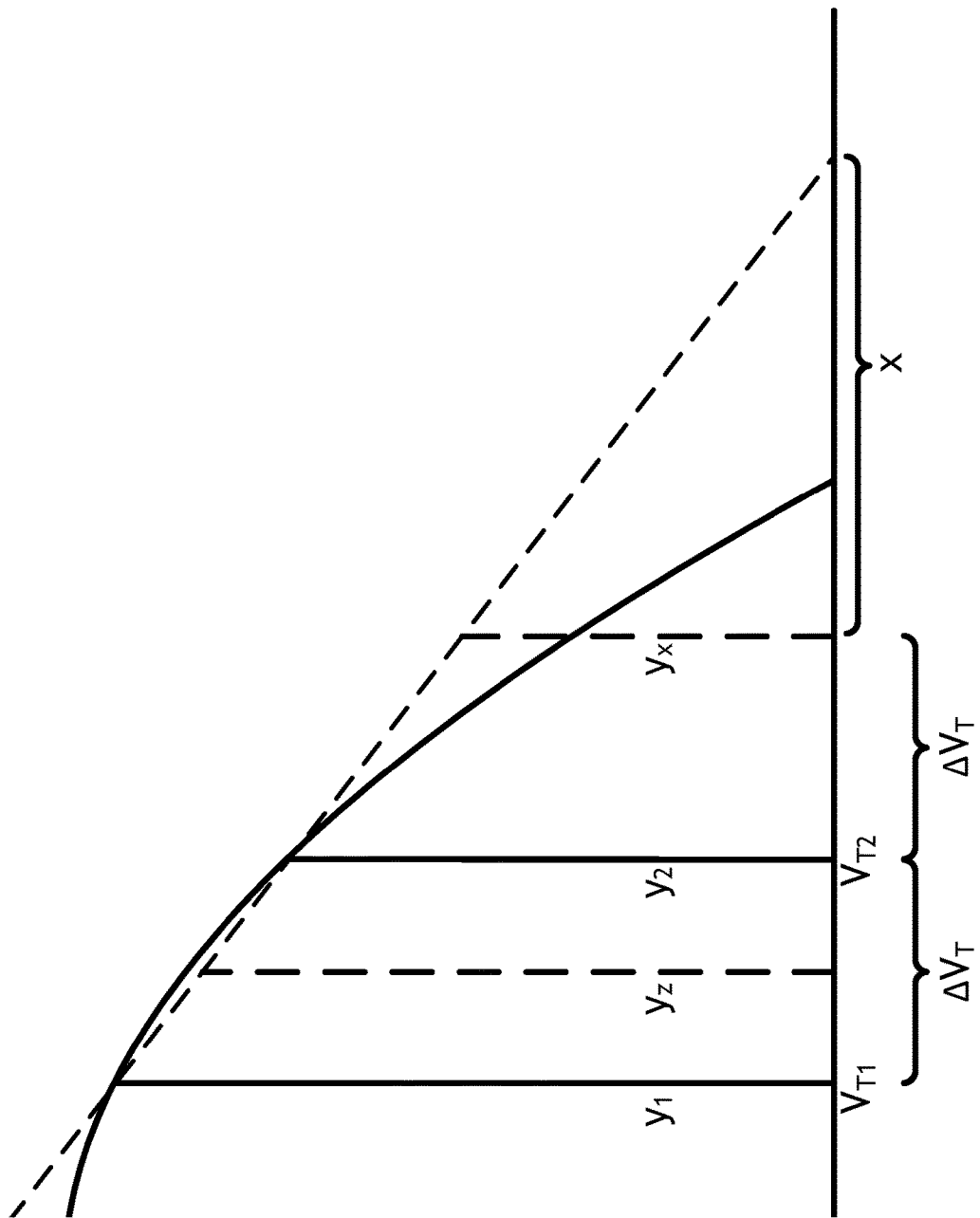
FIG. 9 is a graph illustrating an embodiment of a cumulative distribution function.

Lower page 1-to-0 and 0-to-1 bit flip counts may be interpolated and/or extrapolated using a cumulative distribution function (CDF). FIG. 9 is a graph illustrating an embodiment of a CDF showing bit counts for two distinct reads, $V_{T1}$, $V_{T2}$, separated by $\Delta V_T$. In certain embodiments, the portion of the CDF between the two reads can be expressed by an approximately-liner relationship in the log domain. For example, the CDF (overlapped area) may be expressed by the following equation: $\ln(y)=A+B^*V_T$. (y is, e.g., the 1-to-0 bit flip count). Therefore, based on geometry, it can get that the slope, $B=\{\ln(y_1)-\ln(y_2)\}/\Delta V_T$. The known points, $y_1$ or $y_2$ can be used to derive the value of A in the above equation. For example, the following equation may be used to derive the value of A:

$$A = \ln(y) - B*V_T$$
$$= \ln(y_2) - \{\ln(y_1) - \ln(y_2)\}/\Delta V_T * V_{T2}$$
$$= \{\ln(y_2)*\Delta V_T - \ln(y_1)*V_{T2} + \ln(y_2)*V_{T2}\}/\Delta V_T$$
$$= \{\ln(y_2)*(\Delta V_T + V_{T2}) - \ln(y_1)*V_{T2}\}/\Delta V_T$$

Therefore, an extrapolated flipped bit count value $y_x$ can be determined based on the line equation above.

The interpolation point $y_z$ may be derived according to similar principles. Therefore, given two or more 1-to-0 or 0-to-1 bit flip count data points, it may be possible to estimate the 1-to-0 or 0-to-1 count corresponding to an interpolated or extrapolated data point.

Upper page 1-to-0 and 0-to-1 counts may be derived the same way as above, except that each count is split into two data. For example, one count may correspond to the '0' cell value for the lower page, and the other may correspond to the '1' cell value for the lower page.

In certain embodiments, once the system has interpolated and/or extrapolated additional virtual voltage reading threshold values, the calibration logic may be directed to calculate LUT values in a similar way as regular LUT calibration, discussed above. Such LUTs may be used in a similar manner to those discussed above.

Figure 10:
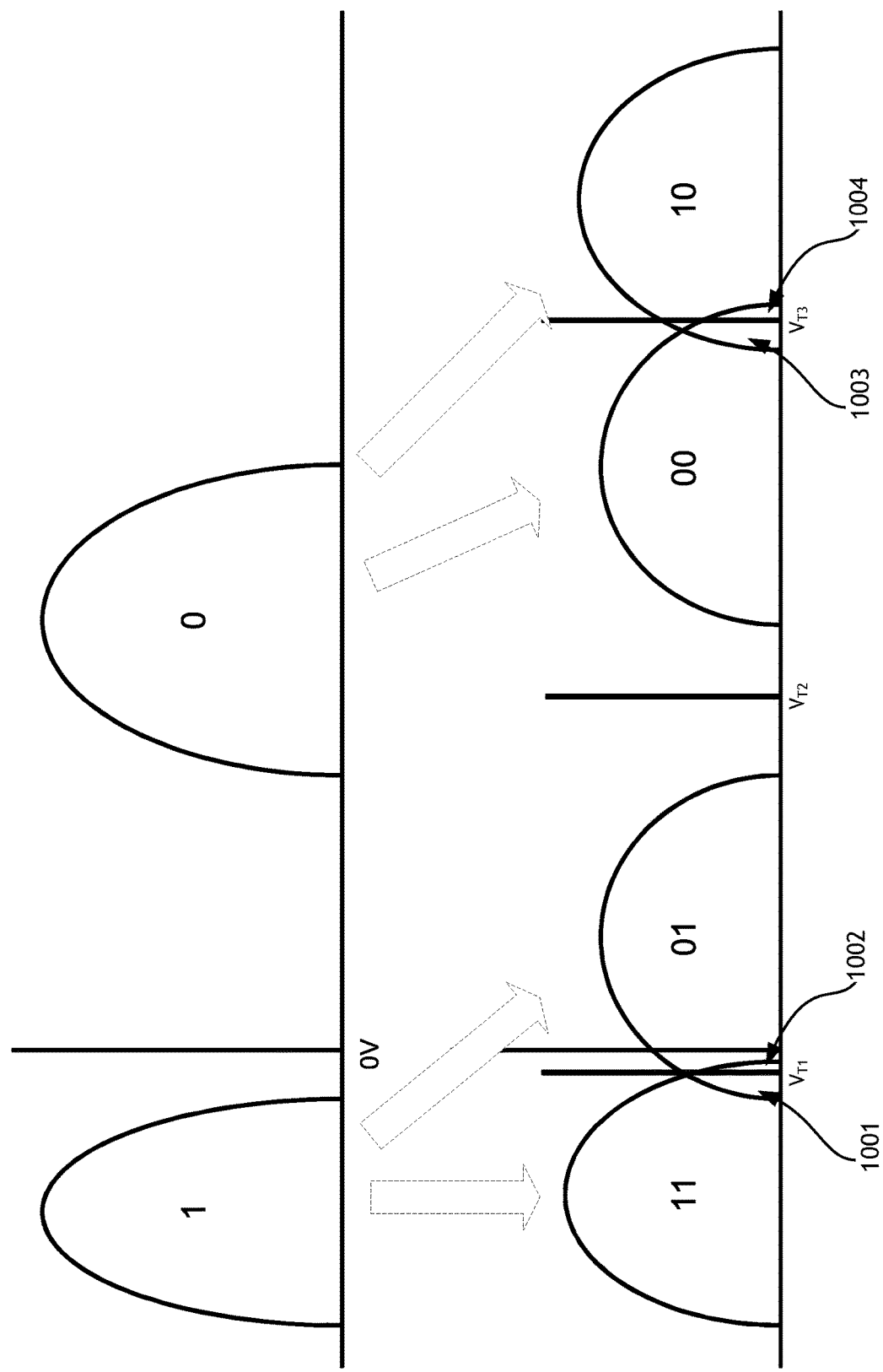
FIG. 10 illustrates an embodiment of a voltage distribution graph showing the separation of lower page data into different upper page distributions.

FIG. 10 illustrates an embodiment of a voltage distribution graph showing the separation of lower page data into different upper page distributions. Generally, 1-to-0 and 0-to-1 counts are not directly related with low/up lobe crossing. As shown, $V_{T1}$ and $V_{T3}$ may be used to determine 0/1 value in the upper page. The areas illustrated represent the following bit flip counts: the area 1001 represents the 0-to-1 bit flip count with lower page bit equal to '1'; the area 1002 represents the 1-to-0 bit flip count with lower page bit equal to '1'; the area 1003 represents the 1-to-0 bit flip count with lower page bit equal to '0'; and the area 1004 represents the 0-to-1 bit flip count with lower page bit equal to '0,' each of which may be derived from reads at the various voltage read levels illustrated. The read level $V_{T2}$ may be used as the lower page reference threshold. In certain embodiments, provided the correct lower page value for each memory cell, it may be possible to determine whether a given 1-to-0 or 0-to-1 bit flip happens at threshold $V_{T1}$ or $V_{T3}$.

Other Variations

The read levels, states, and coding schemes associated with voltage level distributions described herein, as well as variables and designations used to represent the same, are used for convenience only. As used in this application, "non-volatile solid-state memory" typically refers to solid-state memory such as, but not limited to, NAND flash. However, the systems and methods of this disclosure may also be useful in more conventional hard drives and hybrid hard drives including both solid-state and hard drive components. The solid-state storage devices (e.g., dies) may be physically divided into planes, blocks, pages, and sectors, as is known in the art. Other forms of storage (e.g., battery backed-up volatile DRAM or SRAM devices, magnetic disk drives, etc.) may additionally or alternatively be used.

Those skilled in the art will appreciate that in some embodiments, other types of data storage systems and/or data retention monitoring can be implemented. In addition, the actual steps taken in the processes shown in FIGS. 4 and 6 may differ from those shown in the figures. Depending on the embodiment, certain of the steps described above may be removed, others may be added. Accordingly, the scope of the present disclosure is intended to be defined only by reference to the appended claims.

While certain embodiments have been described, these embodiments have been presented by way of example only, and are not intended to limit the scope of protection. Indeed, the novel methods and systems described herein may be embodied in a variety of other forms. Furthermore, various omissions, substitutions and changes in the form of the methods and systems described herein may be made. The accompanying claims and their equivalents are intended to cover such forms or modifications as would fall within the scope and spirit of the protection. For example, the various components illustrated in the figures may be implemented as software and/or firmware on a processor, ASIC/FPGA, or dedicated hardware. Also, the features and attributes of the specific embodiments disclosed above may be combined in different ways to form additional embodiments, all of which fall within the scope of the present disclosure. Although the present disclosure provides certain preferred embodiments and applications, other embodiments that are apparent to those of ordinary skill in the art, including embodiments which do not provide all of the features and advantages set forth herein, are also within the scope of this disclosure. Accordingly, the scope of the present disclosure is intended to be defined only by reference to the appended claims.

What is claimed is:

1. A data storage device comprising:
a non-volatile solid-state memory array comprising a plurality of non-volatile solid-state memory devices configured to store data; and
a controller configured to generate multiple-bit log likelihood ratios (LLRs) by at least:
determining a reference bit stream stored in a reference memory location;
generating a plurality of read bit streams by performing a plurality of reads of the reference memory location, wherein each of the plurality of reads is performed at one of a plurality of voltage read levels;
comparing each read bit stream of the plurality of read bit streams and the reference bit stream to determine respective flipped-bit data, different than LLRs, for each read bit stream;
extrapolating flipped-bit data based on each of the determined respective flipped-bit data for the plurality of read bit streams;
generating new reference LLR values, different than the extrapolated flipped-bit data and associated with the reference memory location, using each of the determined respective flipped-bit data for the plurality of read bit streams and the extrapolated flipped-bit data;
storing the generated reference LLR values for use in future decoding operations; and
decoding target data using the stored reference LLR values.

2. The data storage device of claim 1, wherein the controller is further configured to store the LLR values in the non-volatile solid-state memory array.

3. The data storage device of claim 1, wherein the controller is further configured to:
generate a target read bit stream by performing a plurality of reads of a target memory location;
generate a sequence of LLR values for decoding the target memory location based at least in part on the reference LLR values and the target read bit stream; and
decode data from the target memory location using the generated sequence of LLR values.

4. The data storage device of claim 3, wherein the target memory location and the reference memory location have similar age characteristics.

5. The data storage device of claim 3, wherein the target memory location and the reference memory location are determined to have similar read/write cycling characteristics.

6. The data storage device of claim 3, wherein the target memory location and the reference memory location are located in a same memory block of the non-volatile solid-state memory array.

7. The data storage device of claim 1, wherein the controller is further configured to estimate the extrapolated flipped-bit data based on linear log domain extrapolation of a cumulative distribution function associated with the reference memory location.

8. The data storage device of claim 1, wherein the controller is further configured to estimate interpolated flipped-bit data based at least in part on the determined respective flipped-bit data.

9. The data storage device of claim 8, wherein the reference LLR values are generated based on the determined respective flipped-bit data for each read bit stream and the interpolated flipped-bit data.

10. In a data storage system comprising a non-volatile solid-state memory array and a controller, a method of generating multiple-bit log likelihood ratios (LLRs), the method comprising:
   determining a reference bit stream stored in a reference memory location of a non-volatile solid-state memory array of a data storage system;
   generating a plurality of read bit streams by performing a plurality of reads of the reference memory location, wherein each of the plurality of reads is performed at one of a plurality of voltage read levels;
   comparing each read bit stream of the plurality of read bit streams and the reference bit stream to determine respective flipped-bit data, different than LLRs, for each read bit stream;
   extrapolating flipped-bit data based on each of the determined respective flipped-bit data for the plurality of read bit streams;
   generating new reference LLR values, different than the extrapolated flipped-bit data and associated with the reference memory location, using each of the determined respective flipped-bit data for the plurality of read bit streams and the extrapolated flipped-bit data;
   storing the generated reference LLR values for use in future decoding operations; and
   decoding target data using the stored reference LLR values.

11. The method of claim 10, further comprising:
   generating a target read bit stream by performing a plurality of reads of a target memory location;
   generating a sequence of LLR values for decoding the target memory location based at least in part on the LLR values and on the target read bit stream; and
   decoding data from the target memory location using the generated sequence of LLR values.

12. The method of claim 11, wherein the target memory location and the reference memory location are determined to have similar read/write cycling characteristics.

13. The method of claim 11, wherein the target memory location and the reference memory location are located in a same memory block of the non-volatile solid-state memory array.

14. A controller device comprising:
   one or more processors; and
   an electrical interface for communicating with a non-volatile solid-state memory array comprising a plurality of non-volatile solid-state memory devices configured to store data;
   wherein the controller device is configured to:
      determine a reference bit stream stored in a reference memory location of the non-volatile solid-state memory array;
      generate a plurality of read bit streams by performing a plurality of reads of the reference memory location, wherein each of the plurality of reads is performed at one of a plurality of voltage read levels;
      compare each read bit stream of the plurality of read bit streams and the reference bit stream to determine respective flipped-bit data, different than LLRs, for each read bit stream;
      extrapolate flipped-bit data based on each of the determined respective flipped-bit data for the plurality of read bit streams;
      generate new reference LLR values, different than the extrapolated flipped-bit data and associated with the reference memory location, using each of the determined respective flipped-bit data for the plurality of read bit streams and the extrapolated flipped-bit data;
      store the generated reference LLR values for use in future decoding operations; and
      decode target data using the stored reference LLR values.

15. The controller device of claim 14, wherein the controller device is further configured to:
   generate a target read bit stream by performing a plurality of reads of a target memory location;
   generate a sequence of LLR values for decoding the target memory location based at least in part on the reference LLR values and on the target read bit stream; and
   decode data from the target memory location using the generated sequence of LLR values.

16. The controller device of claim 15, wherein the target memory location and the reference memory location are located in a same memory block of the non-volatile solid-state memory array.

* * * * *